United States Patent
Satoh

(10) Patent No.: US 9,478,502 B2
(45) Date of Patent: Oct. 25, 2016

(54) DEVICE IDENTIFICATION ASSIGNMENT AND TOTAL DEVICE NUMBER DETECTION

(75) Inventor: Yasuo Satoh, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 369 days.

(21) Appl. No.: 13/559,235

(22) Filed: Jul. 26, 2012

(65) Prior Publication Data

US 2014/0027771 A1   Jan. 30, 2014

(51) Int. Cl.
| | |
|---|---|
| *H01L 23/544* | (2006.01) |
| *G11C 5/04* | (2006.01) |
| *G11C 8/12* | (2006.01) |
| *G11C 5/02* | (2006.01) |
| G11C 7/20 | (2006.01) |
| G11C 16/20 | (2006.01) |
| H01L 25/065 | (2006.01) |
| G11C 29/44 | (2006.01) |

(52) U.S. Cl.
CPC .............. *H01L 23/544* (2013.01); *G11C 5/025* (2013.01); *G11C 5/04* (2013.01); *G11C 8/12* (2013.01); *G11C 16/20* (2013.01); *G11C 2029/4402* (2013.01); *H01L 25/0657* (2013.01); *H01L 2223/5444* (2013.01); *H01L 2223/54473* (2013.01); *H01L 2224/16145* (2013.01); *H01L 2225/06513* (2013.01); *H01L 2225/06541* (2013.01)

(58) Field of Classification Search
CPC .............. H01L 23/544; H01L 25/0657; H01L 2223/5444; H01L 2223/54473; H01L 2224/16145; H01L 2225/06513; H01L 2225/06541; G11C 16/20; G11C 7/1015–7/1045; G11C 7/10–7/1012
See application file for complete search history.

(56) References Cited

U.S. PATENT DOCUMENTS

| | | | | |
|---|---|---|---|---|
| 5,838,891 | A * | 11/1998 | Mizuno | G06F 3/0601 |
| | | | | 711/100 |
| 6,269,411 | B1 * | 7/2001 | Reasoner | G06F 3/0605 |
| | | | | 369/30.35 |
| 6,460,093 | B1 * | 10/2002 | Taugher | G06F 9/4411 |
| | | | | 710/10 |
| 6,535,981 | B1 * | 3/2003 | Shimizu | A63F 13/10 |
| | | | | 235/375 |
| 6,643,787 | B1 * | 11/2003 | Zerbe et al. | 713/400 |
| 6,740,981 | B2 * | 5/2004 | Hosomi | G11C 8/12 |
| | | | | 257/686 |
| 7,123,497 | B2 * | 10/2006 | Matsui | G11C 5/00 |
| | | | | 365/189.14 |

(Continued)

FOREIGN PATENT DOCUMENTS

| | | |
|---|---|---|
| TW | 201411812 A | 3/2014 |
| WO | WO-2014018772 A1 | 1/2014 |

OTHER PUBLICATIONS

"International Application Serial No. PCT/US2013/052091, International Search Report mailed Nov. 1, 2013", 3 pgs.

(Continued)

*Primary Examiner* — William F Kraig
*Assistant Examiner* — Maliheh Malek
(74) *Attorney, Agent, or Firm* — Schwegman Lundberg & Woessner, P.A.

(57) ABSTRACT

Various embodiments comprise apparatuses to assign a respective one of a sequence of unique device identification (ID) values to each die in a stacked device. In an embodiment, each die may include a respective assignment device to operate on an input and generate, as an output, the respective one of the sequence of the unique device ID values. Each die may also include a respective evaluation device to detect a total number of dice in the stack. Additional apparatuses and methods are described.

31 Claims, 5 Drawing Sheets

(56) References Cited

U.S. PATENT DOCUMENTS

| | | | | |
|---|---|---|---|---|
| 7,221,057 | B2* | 5/2007 | Goto | H01L 23/50 257/686 |
| 7,494,846 | B2* | 2/2009 | Hsu | G11C 5/02 257/E21.513 |
| 7,760,533 | B2 | 7/2010 | Alzheimer | |
| 7,816,934 | B2* | 10/2010 | Keeth | G11C 5/02 324/750.3 |
| 7,917,818 | B2* | 3/2011 | Niijima | G06F 11/267 714/30 |
| 7,925,949 | B2* | 4/2011 | Jeddeloh | G11C 5/02 365/200 |
| 7,964,946 | B2* | 6/2011 | Kwang | H01L 24/32 257/685 |
| 8,032,804 | B2* | 10/2011 | Jeddeloh | G06F 11/073 257/686 |
| 8,130,527 | B2* | 3/2012 | Keeth | 365/51 |
| 8,399,298 | B2* | 3/2013 | Wu | G11C 5/06 257/E21.499 |
| 8,539,420 | B2* | 9/2013 | Camarota | 716/126 |
| 8,559,258 | B1* | 10/2013 | Stephens, Jr. | 365/222 |
| 8,578,591 | B2* | 11/2013 | Hargan | G11C 5/02 257/678 |
| 8,618,541 | B2* | 12/2013 | Yang | H01L 25/06 257/48 |
| 8,778,734 | B2* | 7/2014 | Metsis | 438/109 |
| 8,861,242 | B2* | 10/2014 | Keeth | 365/51 |
| 2003/0135699 | A1* | 7/2003 | Matsuzaki et al. | 711/149 |
| 2004/0232559 | A1* | 11/2004 | Adelmann | H01L 23/3128 257/777 |
| 2005/0010725 | A1* | 1/2005 | Eilert | 711/132 |
| 2005/0082664 | A1* | 4/2005 | Funaba | H01L 23/544 257/724 |
| 2005/0102477 | A1* | 5/2005 | Sukegawa | G06F 12/0831 711/141 |
| 2006/0206745 | A1* | 9/2006 | Prengel | G06F 1/10 713/600 |
| 2007/0014140 | A1* | 1/2007 | Telecco et al. | 365/63 |
| 2007/0126105 | A1* | 6/2007 | Yamada | G11C 5/02 257/686 |
| 2007/0194447 | A1* | 8/2007 | Ruckerbauer | G11C 5/02 257/734 |
| 2008/0054488 | A1* | 3/2008 | Leddige | H01L 23/5387 257/777 |
| 2008/0220565 | A1* | 9/2008 | Hsu | G11C 5/02 438/109 |
| 2009/0039915 | A1* | 2/2009 | Ruckerbauer et al. | 326/38 |
| 2009/0085608 | A1* | 4/2009 | Alzheimer | G06F 13/14 326/86 |
| 2009/0096478 | A1* | 4/2009 | Keeth | G11C 5/02 324/756.05 |
| 2009/0154285 | A1* | 6/2009 | Pyeon | G11C 5/025 365/233.1 |
| 2009/0249014 | A1* | 10/2009 | Obereiner | G06F 12/1441 711/164 |
| 2009/0289701 | A1 | 11/2009 | Silvestri | |
| 2010/0059898 | A1* | 3/2010 | Keeth | H01L 25/0657 257/777 |
| 2010/0064114 | A1* | 3/2010 | Keeth | 711/220 |
| 2010/0074038 | A1* | 3/2010 | Ruckerbauer | G11C 7/1006 365/200 |
| 2010/0078829 | A1* | 4/2010 | Hargan | H01L 25/0657 257/777 |
| 2010/0131684 | A1* | 5/2010 | Johnson | G11C 5/02 710/104 |
| 2011/0050303 | A1* | 3/2011 | Ma | G11C 7/222 327/158 |
| 2011/0060942 | A1* | 3/2011 | Vorbach | G06F 12/00 714/6.2 |
| 2011/0079923 | A1* | 4/2011 | Suh | G11C 5/02 257/777 |
| 2011/0079924 | A1* | 4/2011 | Suh | G11C 5/00 257/777 |
| 2011/0090004 | A1* | 4/2011 | Schuetz | 327/564 |
| 2011/0102065 | A1* | 5/2011 | Jin | G11C 5/04 327/524 |
| 2011/0134705 | A1* | 6/2011 | Jones et al. | 365/189.02 |
| 2011/0141828 | A1* | 6/2011 | Yoko | 365/189.09 |
| 2011/0148469 | A1* | 6/2011 | Ito et al. | 327/77 |
| 2011/0157951 | A1* | 6/2011 | Hung | G11C 5/02 365/63 |
| 2011/0194326 | A1* | 8/2011 | Nakanishi et al. | 365/51 |
| 2011/0195529 | A1 | 8/2011 | Wu | |
| 2011/0228783 | A1* | 9/2011 | Flynn | G06F 13/4022 370/394 |
| 2011/0246746 | A1* | 10/2011 | Keeth et al. | 712/29 |
| 2011/0260331 | A1* | 10/2011 | Lee | H01L 23/544 257/774 |
| 2011/0272788 | A1* | 11/2011 | Kim et al. | 257/618 |
| 2011/0302058 | A1* | 12/2011 | Hashiura | G06Q 30/0641 705/27.1 |
| 2012/0025391 | A1* | 2/2012 | Imai | G11C 8/12 257/773 |
| 2012/0069685 | A1* | 3/2012 | Ide | G11C 29/787 365/189.05 |
| 2012/0092943 | A1* | 4/2012 | Nishioka | G11C 16/20 365/191 |
| 2012/0119357 | A1* | 5/2012 | Byeon | H01L 25/0657 257/737 |
| 2012/0126848 | A1* | 5/2012 | Wu | G11C 5/02 326/21 |
| 2012/0146707 | A1* | 6/2012 | Riho | 327/419 |
| 2012/0161814 | A1* | 6/2012 | Keeth | 326/101 |
| 2012/0182042 | A1* | 7/2012 | Jeong | G11C 7/20 326/9 |
| 2012/0195148 | A1* | 8/2012 | Yoko | G11C 5/04 365/219 |
| 2012/0196402 | A1* | 8/2012 | Coteus et al. | 438/107 |
| 2012/0254472 | A1* | 10/2012 | Ware | G11C 5/02 710/3 |
| 2013/0009694 | A1* | 1/2013 | Camarota | 327/526 |
| 2013/0021866 | A1* | 1/2013 | Lee | 365/230.01 |
| 2013/0094271 | A1* | 4/2013 | Schuetz | 365/63 |
| 2013/0094301 | A1* | 4/2013 | Min | 365/189.02 |
| 2013/0119542 | A1* | 5/2013 | Oh | H01L 25/0657 257/738 |
| 2013/0155794 | A1* | 6/2013 | Wu | G11C 29/802 365/200 |
| 2013/0230932 | A1* | 9/2013 | Bringivijayaraghavan et al. | 438/4 |
| 2013/0279253 | A1* | 10/2013 | Ogawa | G11C 8/12 365/185.05 |
| 2013/0326294 | A1* | 12/2013 | Lo et al. | 714/718 |
| 2013/0336039 | A1* | 12/2013 | Frans | 365/51 |
| 2013/0340068 | A1* | 12/2013 | Lee | G06F 21/70 726/16 |
| 2014/0097891 | A1* | 4/2014 | Schuetz | 327/564 |
| 2014/0160867 | A1* | 6/2014 | Veches et al. | 365/189.011 |
| 2014/0192583 | A1* | 7/2014 | Rajan et al. | 365/63 |
| 2014/0205056 | A1* | 7/2014 | Yamamoto | G11C 7/1051 377/54 |
| 2015/0009743 | A1* | 1/2015 | Chung | G11C 29/028 365/96 |
| 2015/0234707 | A1* | 8/2015 | Vogelsang | G11C 29/44 714/764 |

OTHER PUBLICATIONS

"International Application Serial No. PCT/US2013/052091, Written Opinion mailed Nov. 1, 2013", 8 pgs.

"International Application Serial No. PCT/US2013/052091, International Preliminary Report on Patentability mailed Dec. 1, 2014", 5 pgs.

* cited by examiner

DEVICE IDENTIFICATION ASSIGNMENT AND TOTAL DEVICE NUMBER DETECTION

BACKGROUND

Computers and other electronic systems, for example, digital televisions, digital cameras, and cellular phones, often have one or more memory and other devices to store information. Increasingly, memory and other devices are being reduced in size to achieve a higher density of storage capacity and/or a higher density of functionality.

DETAILED DESCRIPTION

Figure 1:
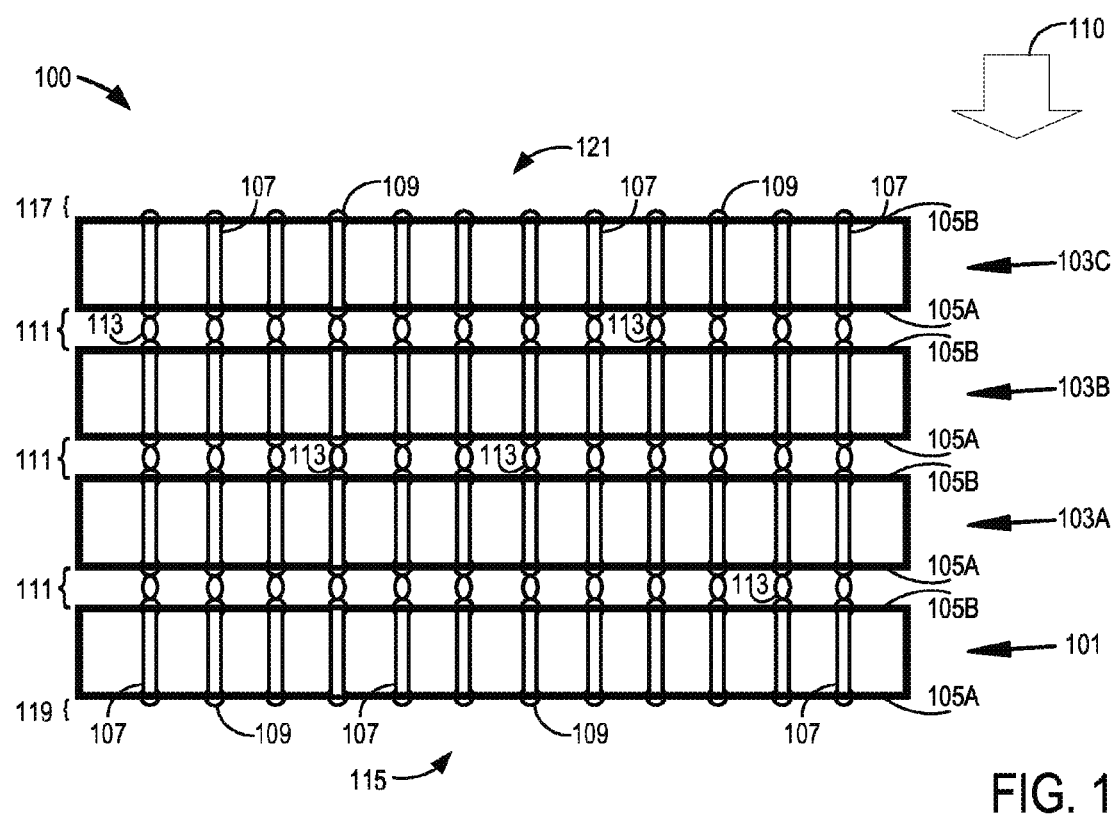
FIG. 1 shows a cross-sectional view of a microelectronics package having a number of stacked and interconnected integrated circuit dice, according to various embodiments of the invention.

The description that follows includes illustrative apparatuses (circuitry, devices, structures, systems, and the like) and methods (e.g., processes, protocols, sequences, techniques, and technologies) that embody the subject matter. In the following description, for purposes of explanation, numerous specific details are set forth in order to provide an understanding of various embodiments of the subject matter. After reading this disclosure, it will be evident to person of ordinary skill in the art however, that various embodiments of the subject matter may be practiced without these specific details. Further, well-known apparatuses and methods have not been shown in detail so as not to obscure the description of various embodiments.

In order to increase integrated circuit device density within a given area (e.g., a footprint on an electrical device), for example, integrated circuit dice and other device types (e.g., ASICs, boards, cards, controllers, FPGAs, logic, microelectronics packages, microprocessors, modules, peripherals, sensors, systems on chips, etc.) may be stacked on top of one another. One such example includes stacked memory dice, where a number of dice are stacked to increase an overall amount of memory within the given area. Each die in the stack may have a number of integrated circuit devices fabricated on a substrate comprising the die. Some dice within the stack may operate to communicate with other dice in the stack (e.g., slave dice may communicate with a master die to perform their functions). Such stacks may be interconnected from one side of the substrate to the other. The interconnections include through-substrate vias (TSVs). When the substrate comprises silicon, the interconnections may also be referred to as through-silicon vias.

Addressable devices typically make use of a mechanism by which each device can be addressed independently from other devices residing on the same bus. Addressable devices used in stacked configurations may provide this capability by assigning each device a unique device identifier (ID) value. The device ID value may be configured in the assembly process by selectively bonding several device ID bonding pads to power (e.g., $V_{DD}$) or ground (e.g., $V_{ss}$), thereby encoding a unique device ID value. Some of the embodiments described herein operate to automatically assign a device ID value to each device in a stack of devices. The device ID value may be assigned either during manufacture or at some later time (e.g., if other devices are later added or removed). These elements, and circuitry used to detect a total number of devices in the stack, will now be described.

Various embodiments of the disclosed subject matter include an apparatus for generating a unique device ID value for each addressable device in a multi-device stacked package, such as a stacked-CSP (chip scale package). Generation of the unique device ID value for each stacked device can be accomplished by including circuitry for each addressable device that generates a device ID value based on an input device ID value signal. The addressable device may then operate to provide an output value corresponding to the generated device ID value to another device in the stack, such as for assignment thereto.

Referring now to FIG. 1, a cross-sectional view of a microelectronics package 100 having a number of stacked and interconnected integrated circuit dice, according to various embodiments of the invention, is shown. The stacked and interconnected dice may form at least a portion of a microelectronics package. The microelectronics package 100 is shown to include four integrated circuit dice. In this example, the four integrated circuit dice include a master die 101, and three slave dice 103A, 103B, 103C. The three slave dice 103A, 103B, 103C may be identified individually as the first, the second, and the third slave die, respectively. However, the identification as first, second, and third does not necessarily indicate any type of order or importance and is simply provided for ease in identification throughout the various embodiments. Any one or more of the master die 101 or the three slave dice 103A, 103B, 103C may operate to provide a generated device ID value to other devices, as described herein.

In other embodiments, the microelectronics package 100 may contain any other desired number of integrated circuit dice. Each of the integrated circuit dice has a first surface 105A and a second surface 105B. An arrow 110 indicates a normal orientation of the dice in which the first surface 105A is located at an upper surface of the substrate where the upper surface is generally used during fabrication of integrated circuit devices on the substrate. That is, the upper surface of the substrate is the surface that may be used to form integrated circuit devices on a die.

A number of through-substrate vias (TSVs) 107 is shown on each of the four dice, including the master die 101, and the slave dice 103A, 103B, 103C. The TSVs 107 may also be referred to as through-silicon vias, depending upon the substrate type (e.g., silicon or other elemental semiconductors, compound semiconductors, or other substrate types known in the art, including those used in the formation of device cards) from which the dice are formed. The TSVs 107 may be formed from the first surface 105A through the integrated circuit die to the second surface 105B (or alternatively, from the second surface 105B to the first surface 105A). In operation, the TSVs 107 can be selectively connected to certain metallization layers within the die and therefore allow an interconnection from, for example, integrated circuit devices formed on the first surface 105A and through to the second surface 105B of the master die 101, to connect to one or more of the slave dice 103A, 103B, 103C, in the stack. Other types of vias may pass only partially through the integrated circuit die.

The TSVs 107 may function, for example, electrically, optically, or otherwise. The TSVs 107 allow signals to travel electrically, optically, or otherwise between the master die 101 and various ones of the slave dice 103A, 103B, 103C.

Each of the TSVs 107 has a conductive bonding pad 109 formed on either end or both ends of the TSVs 107. Adjacent ones of the dice are electrically coupled by a conductive electrical connector 113 that is formed (e.g., placed) between the conductive bonding pads. The conductive electrical connector 113 may be, for example, a wirebond, a solder ball, conductive tape, a Controlled Collapse Chip Connection (C4) interconnect, or other suitable electrical connector. The conductive electrical connectors 113 therefore form electrical interconnects 111 between each of the adjacent dice. The conductive bonding pads 109 on the first surface 105A of the master die 101 may be accessible to form an external interface 115. The external interface 115 allows interconnection with other devices such as, for example, a microprocessor. The external interface may be connected to pins (not shown) of the microelectronic package by bonding wires allowing accessibility from outside the package. Similarly, the conductive bonding pads 109 on the second surface 105B of the third slave die 103C form an external slave interface 121 that may be used, for example, to interface with other devices or, alternatively, allow interconnection with other slave dice in a larger stack.

Figure 2A:
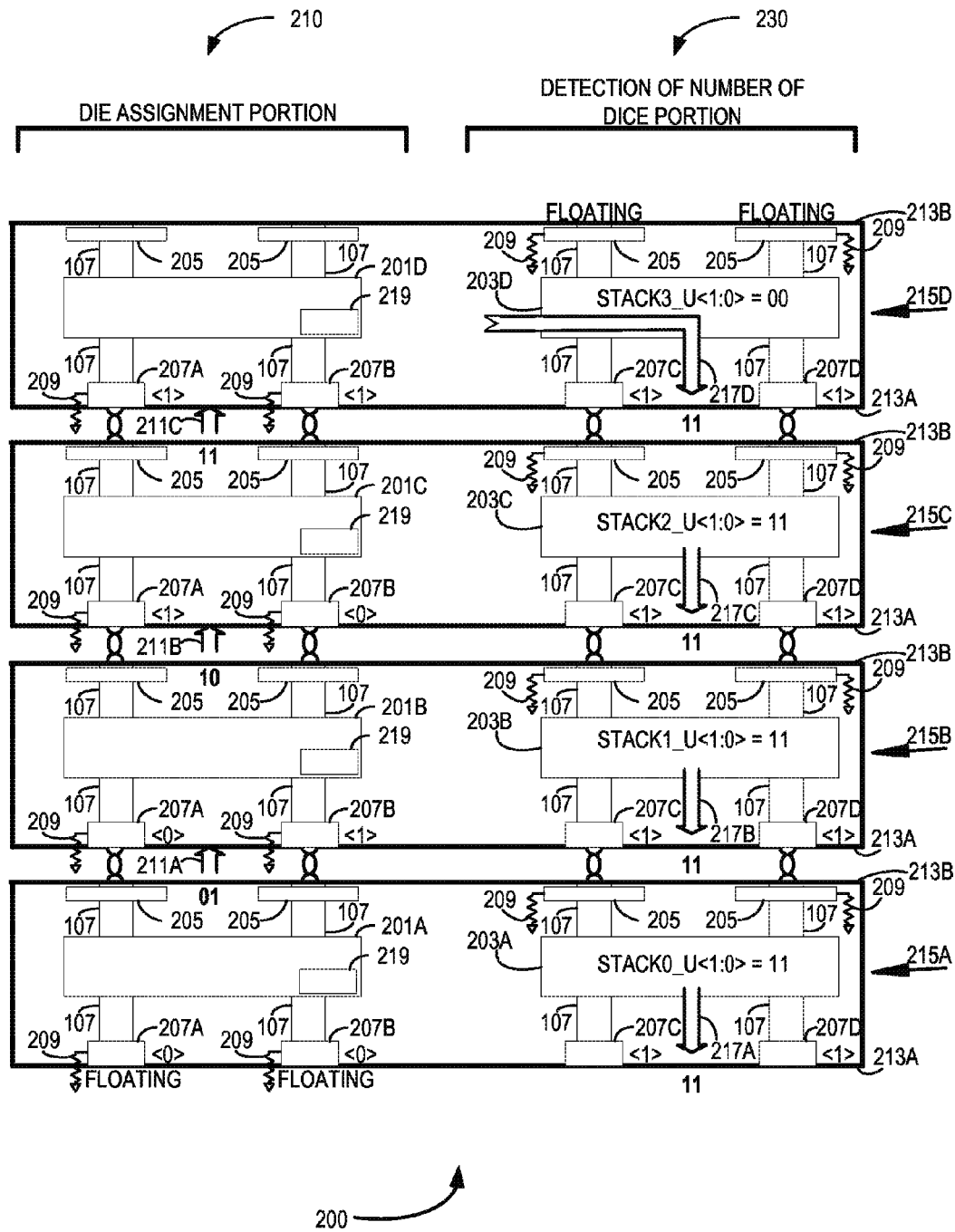
FIG. 2A shows a cross-sectional view of a microelectronics package having four integrated circuit dice that are stacked and interconnected and incorporate embodiments of the described subject matter.

FIG. 2A shows a cross-sectional view of a microelectronics package 200 having four integrated circuit dice 215A, 215B, 215C, 215D that are stacked and interconnected. The integrated circuit dice incorporate embodiments of the described subject matter. The four integrated circuit dice 215A, 215B, 215C, 215D may be identified individually as the first, the second, the third, and the fourth slave die, respectively. However, the identification as first, second, third, and fourth does not necessarily indicate any type of order or importance and is simply provided for ease in identification throughout the various embodiments. Further, in various embodiments, any of the integrated circuit dice 215A, 215B, 215C, 215D may be a master die, possibly similar to or identical to the master die 101 of FIG. 1. In other embodiments, none of the integrated circuit dice 215A, 215B, 215C, 215D is a master die. In this case, each of the integrated circuit dice 215A, 215B, 215C, 215D may be independent of one another and/or controlled by an external controller or other device (not shown in FIG. 2A).

In an embodiment, the integrated circuit dice 215A, 215B, 215C, 215D are addressable devices. In various embodiments, the integrated circuit dice are memory devices. For example, the integrated circuit dice may comprise flash memory, conductive-bridging random access memory (CBRAM), static RAM (SRAM), dynamic RAM (DRAM), or various other types of memory devices. In various embodiments, the integrated circuit dice comprise memory plus logic devices. In various other embodiments, each of the integrated circuit dice 215A, 215B, 215C, 215D may comprise devices different from remaining ones of the integrated circuit devices, such as a processor.

Each die in FIG. 2A includes a die assignment portion 210 and a detection of number of dice portion 230. In each of the integrated circuit dice 215A, 215B, 215C, 215D, the die assignment portion 210 includes a respective assignment device 201A, 201B, 201C, 201D. Further, each die contains a first-level first bonding-pad 207A and a first-level second bonding-pad 207B on a first surface 213A of the die. Each die also has a number of second-level bonding-pads 205 on a second surface 213B. In some embodiments, the second-level bonding-pads 205 may not be on the second surface 213B of the die and may, alternatively, be within the die (e.g., between the first surface 213A and the second surface 213B). In these cases, the second-level bonding-pads 205 may be an internal conductive layer, such as a metal layer. Each of the first-level first bonding-pads 207A, the first-level second bonding-pads 207B, and the second-level bonding-pads 205 are shown to be electrically coupled to respective ones of the TSVs 107. The through-substrate vias 107 of FIG. 2A may also be considered to be contacts or vias.

As described, above, with reference to FIG. 1, the TSVs 107 can serve as signal pass-throughs for device ID value signals. Thus, each of the four integrated circuit dice 215A, 215B, 215C, 215D of FIG. 2A may include additional TSVs. However, only a limited number of TSVs are shown in FIG. 2A. That is, only the TSVs 107 that are used to either assign unique device ID values to each of the devices or to detect the number of dice are shown so as not to obscure details of the disclosed subject matter.

In various embodiments, the assignment devices 201A, 201B, 201C, 201D each comprise a +1 adder circuit. In various embodiments, the assignment devices may comprise combinatorial logic to produce a desired selectable output from a given input. In various embodiments, the assignment devices may comprise a +N adder circuit, a −N adder circuit, an active logical shifter, a passive logical shifter, or various combinations thereof. An output of the assignment device can be based on a signal input to the assignment device. The output of the assignment device can be predetermined based on a design of the circuit. These concepts are explained in more detail, below.

Although the assignment devices 201A, 201B, 201C, 201D of FIG. 2A are shown and described as having a two-bit input and a two-bit output, the assignment devices may include a number of one or more bits for the input and/or output. For example, in a particular embodiment of the disclosed subject matter, a single bit may be used to indicate a respective device ID value for two assignable devices, "0" and "11," representing ID (0) and ID (1). In other embodiments, three or more bits may be used to indicate a device ID value. For example, three bits may be used to indicate a respective unique device ID value for up to eight assignable devices, "000," "001," "010," "011," "100," "101," "110," and "111." That is, $base_{10}$ numbers 0 through 7, representing ID (0) through ID (7).

The number of bits used to indicate the device ID value (N) is at least partially dependent upon a maximum number of addressable devices in the system. For example, if there are two addressable devices in the system, a single bit device ID value is sufficient (N=0, 1). If there are between two and four addressable devices in the system, a two-bit device ID value may be used (N=0, 1, 2, 3). The maximum number of addressable devices in the system should be less than or equal to $2^M$, where M is the number of bits. For example, a three-bit device ID value can accommodate eight dice (e.g., $2^3$) in a stack.

Continuing with the two-bit example shown in FIG. 2A, each of the TSVs 107 is floating, in a default configuration, as indicated on the first surface 213A of the first integrated circuit die 215A. On each die, the first-level first bonding-pad 207A and the first-level second bonding-pad 207B may be coupled to ground through a weak pull-down device 209.

Thus, when the weak pull-down device(s) 209 is activated, a floating input(s) of the assignment device 201 is pulled to ground.

After stacking the dice, the weak pull-down devices 209 on each of the first-level first bonding-pad 207A and the first-level second bonding-pad 207B of each of the integrated circuit dice 215A, 215B, 215C, 215D may be activated. Once activated, an input(s) of the assignment device(s) 201 is tied to ground through the TSV 107 near the first surface 213A. In an example, only the assignment device 201A may have its input pulled to ground to provide an initialization of the assignment device 201A. However, remaining ones of the assignment devices 201B, 201C, 201D may also have their respective inputs initially tied to ground to reduce the possibility that one or more of the devices is not set to an initial input value other than "00" (through, for example, an externally generated voltage spike). Once the inputs of the assignment devices 201A, 201B, 201C, 201D are provided the initialization value of "00," the weak pull-down devices 209 may be deactivated.

For illustration only, in a specific embodiment where the assignment devices are +1 adders, each of the assignment devices 201A, 201B, 201C, automatically generates a respective unique device ID value which is assigned to a respective subsequent one of the integrated circuit dice 215B, 215C, 215D.

For example, the initialization value, which in this example is "00," initially provided by the weak pull-down device 209 becomes the unique device ID value for the first integrated circuit die 215A. The "00" signal becomes the input to a first of the assignment devices 201A. The "00" signal is operated on and produces an output on the second-level bonding-pads 205 of the first integrated circuit die 215A of "01" as indicated by an arrow 211A.

The "01" signal is input as a "0" and a "1" to a second of the assignment devices 201B through the first-level first bonding-pad 207A and the first-level second bonding-pad 207B, respectively. The "01" input to the second of the assignment devices 201B produces an output on the second-level bonding-pads 205 of the second integrated circuit die 215B of "10" as indicated by an arrow 211B.

Similarly, the "10" signal is input as a "1" and a "0" to a third of the assignment devices 201C through the first-level first bonding-pad 207A and the first-level second bonding-pad 207B, respectively. The "10" input to the third of the assignment devices 201C produces an output on the second-level bonding-pads 205 of the third integrated circuit die 215C of "11" as indicated by an arrow 211C.

Finally, the "11" signal is input as a "1" and a "1" to a fourth of the assignment devices 201D through the first-level first bonding-pad 207A and the first-level second bonding-pad 207B, respectively. The "11" input to the fourth of the assignment devices 201D produces an output on the second-level bonding-pads 205 of the fourth integrated circuit die 215D. In various embodiments, the fourth of the assignment devices 201D may not be included since only the input value will be used, as discussed below. However, including the assignment device on all integrated circuit dice enables an unmodified fabrication process since all dice may be identical.

Each of the unique device ID values may be stored in, for example, a non-volatile memory 219 contained within the respective assignment device 201A, 201B, 201C, 201D, or elsewhere on the respective integrated circuit dice 215A, 215B, 215C, 215D.

In some embodiments, a pull-up device or other switching device may be substituted for the weak pull-down device 209 to pull the TSVs 107 to a power rail. In these embodiments, as will be understood by a person of ordinary skill in the art, once, for example, the pull-up devices are activated, an input(s) of the assignment device(s) 201 is tied to, for example, $V_{DD}$, through the TSV 107 near the first surface 213A. Thus, the initial input of each of the assignment devices becomes "11." The examples that follow are then modified to accommodate the "11" initialization value. For example, a +N adder may be substituted by a −N adder. Additionally, an output signal from each of the assignment devices 201A, 201B, 201C, 201D has a progressively smaller, rather than larger, number.

With continuing reference to FIG. 2A, in each of the integrated circuit dice 215A, 215B, 215C, 215D, the detection of number of dice portion 230 includes evaluation devices 203A, 203B, 203C, 203D. Further, each die contains a first-level third bonding-pad 207C and a first-level fourth bonding-pad 207D on the first surface 213A of the die. Similar to the die assignment portion 210 described above, each die also has a number of second-level bonding-pads 205 on the second surface 213B. In some embodiments, the second-level bonding-pads 205 may not be on the second surface 213B of the die and may, alternatively, be within the die (e.g., between the first surface 213A and the second surface 213B). In these cases, the second-level bonding-pads 205 may be an internal conductive layer, such as a metal layer. Each of the first-level third bonding-pads 207C, the first-level fourth bonding-pads 207D, and the second-level bonding-pads 205 are shown to be electrically coupled to respective ones of the TSVs 107.

In various embodiments, the evaluation devices 203A, 203B, 203C, 203D comprise arbiter circuits. In various embodiments, the evaluation devices may comprise combinatorial logic to produce a desired selectable output based on an evaluation of a given input. In various embodiments, the evaluation devices may comprise digital or analog evaluation devices. In various embodiments, the evaluation devices may comprise combinations of the devices listed. An output value of the evaluation device is based on the evaluation of a signal input to the evaluation device. The output value can be predetermined, based on a design of the circuit. These concepts are explained in more detail with reference to FIG. 2B, below.

Briefly, the weak pull-down devices 209 in the detection of the number of dice portion 230 on each of the second-level bonding-pads 205 of each of the integrated circuit dice 215A, 215B, 215C, 215D may be activated. Once activated, a first input of an evaluation device(s) 203 is tied to ground through the TSV 107 near the second surface 213B. In an example, only the evaluation device 203D may have its first input pulled to ground to provide an initialization of the evaluation device 203D. However, remaining ones of the evaluation devices 203A, 203B, 203C may also have their respective first inputs initially tied to ground to reduce the possibility that one or more of the devices is not set to an initial input value other than "00" (through, for example, an externally generated voltage spike). Once the first inputs of the evaluation devices 203A, 203B, 203C, 203D have an initial input value of "00," the weak pull-down devices 209 in the detection of the number of dice portion 230 may be deactivated.

A fourth one of the evaluation devices 203D (forming a part of the fourth one of the integrated circuit die 215D), receives as a second input the device ID value assigned to the integrated circuit die 215D (e.g., as read from the non-volatile memory 219 of the assignment device 201D and/or from the input to the assignment device 201D). In the example provided above, the input to the fourth assignment device 201D is "11." If the value of the first input of the evaluation device 203D is "00," the evaluation device 203D takes the value of the second input to the evaluation device 203D (in this example, "11") and provides that as an output value. The evaluation criteria are discussed in more detail, below, with reference to FIG. 2B. The output of the fourth evaluation device 203D, as indicated by an arrow 217D, is provided (e.g., fed, transmitted, sent, etc.) through the TSVs 107 to the first input of the third evaluation device 203C.

The third evaluation device 203C (forming a part of the third one of the integrated circuit die 215C), receives as a second input the device ID value assigned to the integrated circuit die 215C (e.g., as read from the non-volatile memory 219 of the assignment device 201C and/or from the input to the assignment device 201C). As noted above, the third evaluation device 203C receives, as a first input, the "11" value output from the fourth evaluation device 203D. Since the first input to the evaluation device 203C is not "00", the output is evaluated to be the same as the received first input value (in this example, "11"), which was received from the fourth evaluation device 203D (e.g., as opposed to the second input value, which in this example is the value "10"). The output, "11," of the third evaluation device 203C, as indicated by an arrow 217C, is provided through the TSVs 107 to the first input of the second evaluation device 203B.

The second evaluation device 203B (forming a part of the second integrated circuit die 215B), receives as a second input the device ID value assigned to the integrated circuit die 215B (e.g., as read from the non-volatile memory 219 of the assignment device 201B and/or from the input to the assignment device 201B). As noted above, the second evaluation device 203B receives, as a first input, the "11" output from the third evaluation device 203C. Since the first input value of the second evaluation device 203B is not "00," the output is evaluated to be the same as the first input value (in this example, "11"), which was received from the third evaluation device 203C (e.g., as opposed to the value of the respective second input, which in this example is "01"). The output, "11," of the second evaluation device 203B, as indicated by an arrow 217B, is provided through the TSVs 107 to the input of the first evaluation device 203A.

The first evaluation device 203A (forming a part of the first integrated circuit die 215A), receives as a second input the device ID value assigned to the integrated circuit die 215A (e.g., as read from the non-volatile memory 219 of the assignment device 201A and/or from the input to the assignment device 201A). As noted above, the first evaluation device 203A receives, as a first input, the "11" output from the second evaluation device 203B. Since the first input value of the first evaluation device 203A is not "00," the output is evaluated to be the same as the first input value (in this example, "11"), which was received from the second evaluation device 203B. The output, "11," of the first evaluation device 203A, as indicated by an arrow 217A, is provided through the TSVs 107 and is available at the first-level third bonding-pad 207C and the first-level fourth bonding-pad 207D at the first surface of the first integrated circuit die 215A. Accordingly, in this example, each of the evaluation devices 203 detected that there were a total of four ("11" equals 3 or a total of 4 (0, 1, 2, 3)) integrated circuit dice in the stack.

Thus, at the completion of the process described above, each of the integrated circuit dice 215A, 215B, 215C, 215D has been assigned a die number, "00," "01," "10," and "11," respectively, by the die assignment portion 210. Additionally, each of the integrated circuit dice 215A, 215B, 215C, 215D has detected a total number of dice in the stack, as determined by the detection of the total number of dice portion 230. Consequently, the address of each die in the stack and the total number of dice in the stack can be assigned automatically.

In some embodiments, and as described above with reference to the die assignment portion 210, a pull-up device may be substituted for the weak pull-down device 209 in the detection of the number of dice portion 230. In these embodiments, as will be understood by a person of ordinary skill in the art, once the pull-up devices are activated, a first input(s) of each of the evaluation devices 203A. 203B, 203C, 203D is tied to, for example, $V_{DD}$, through the respective TSV(s) 107 near the respective second surface(s) 213B. Thus, the first input value of the evaluation device 203D becomes "11." The examples provided above are then modified to accommodate the "11" input signal to the fourth evaluation device 203D. A person of ordinary skill in the art will envision many other ways, for example, two's complement arithmetic in the evaluation devices, to perform similar calculations to determine the total number of dice in the stack based on reading and understanding the disclosure provided herein.

Figure 2B:
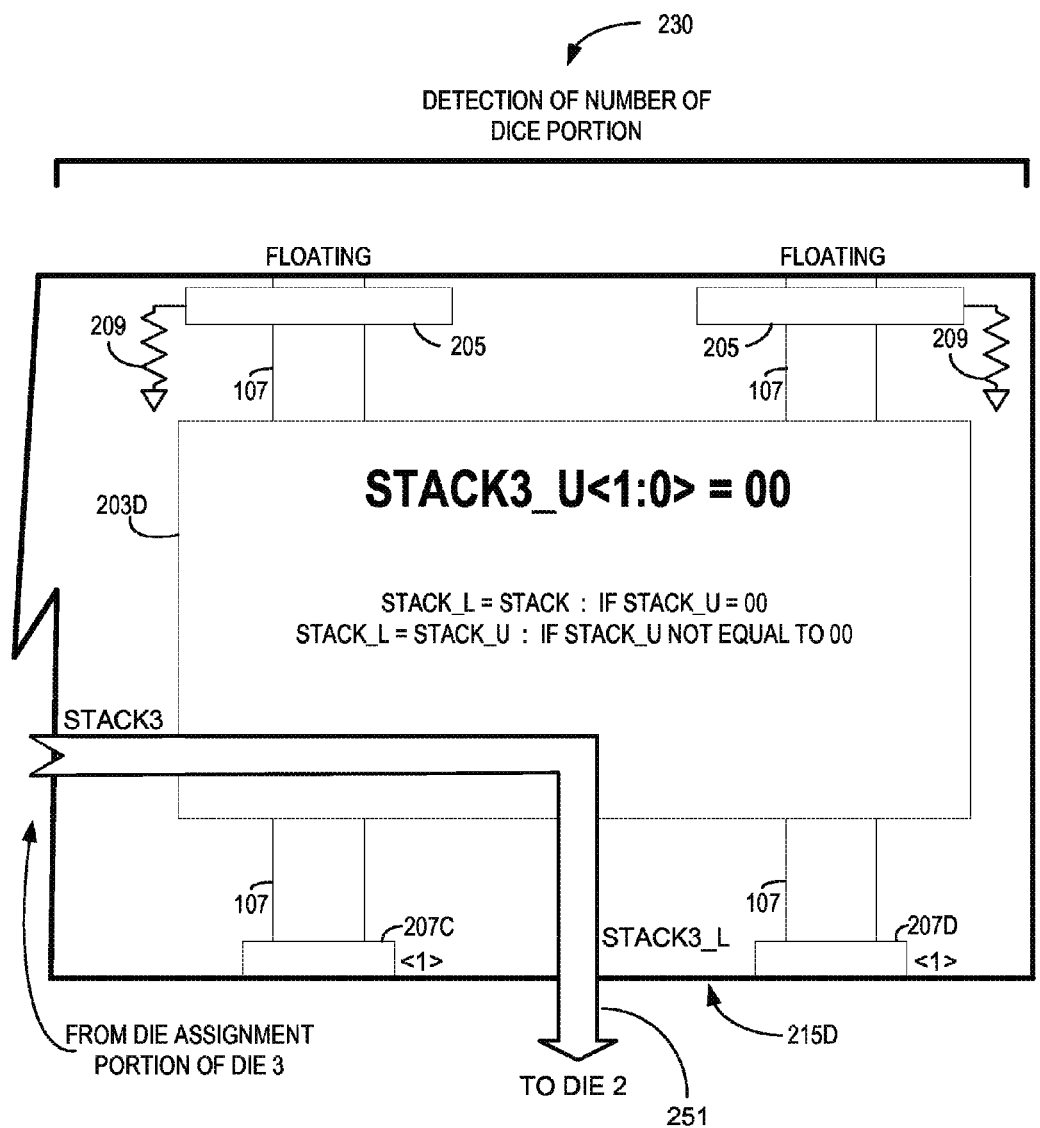
FIG. 2B shows a portion of the fourth integrated circuit die of FIG. 2A.

Referring now to FIG. 2B, a portion of the fourth integrated circuit die 215D of FIG. 2A is shown to more fully describe the evaluation process. As discussed above, the fourth evaluation device 203D receives, as a second input, the device ID value assigned to the die 215D. In a specific embodiment, the fourth evaluation device 203D incorporates a conditional evaluation routine. The evaluation routine may be software, firmware, or hardware-based, or a combination thereof. For example, if the fourth evaluation device 203D is a controller or microprocessor, a software evaluation routine may be embedded within the device. In other examples, an application specific integrated circuit (ASIC), a floating point gate array (FPGA), combinational logic, or some other hardware device may implement the evaluation routine.

In various embodiments, the evaluation routine may first evaluate a first input. For example, after an initialization procedure described above, a variable STACK3_U<1:0> takes the value of the first input, which in the case of the fourth evaluation device 203D as illustrated in FIG. 2A is provided from the second-level bonding-pads being pulled low to obtain a value of "00." The evaluation routine assigns the input value received from the second input "11" to the variable (e.g., memory location) STACK. An evaluation is performed for each stack level L of each of the integrated circuit dice 215A, 215B, 215C, 215D. With reference specifically to the fourth integrated circuit die 215D, on stack level 3 ("11"), the location STACK_L receives the value assigned to STACK if the location STACK_U="00." Since the location STACK_U holds the value "00" as discussed, the location STACK_L receives the value "11." Consequently, the output of the evaluation device 203D is provided as a first input to an evaluation device 203 on a subsequent die 215 as indicated by an arrow 251.

Similar to the process just described in the evaluation device 203D, an assignment to the location STACK_L occurs on each of the other three levels (that is, on the remaining ones of the integrated circuit dice 215A, 215B, 215C). However, since the first input to each of the evaluation devices 203A, 203B, 203C in this case is not "00" (since evaluation device 203D provides the value "11" as its output) each corresponding device location takes the value of the first input, "11." Thus, each of the evaluation devices 203A, 203B, 203C, 203D has been assigned the value of the total number of dice, "11," in the stack.

Figure 3:
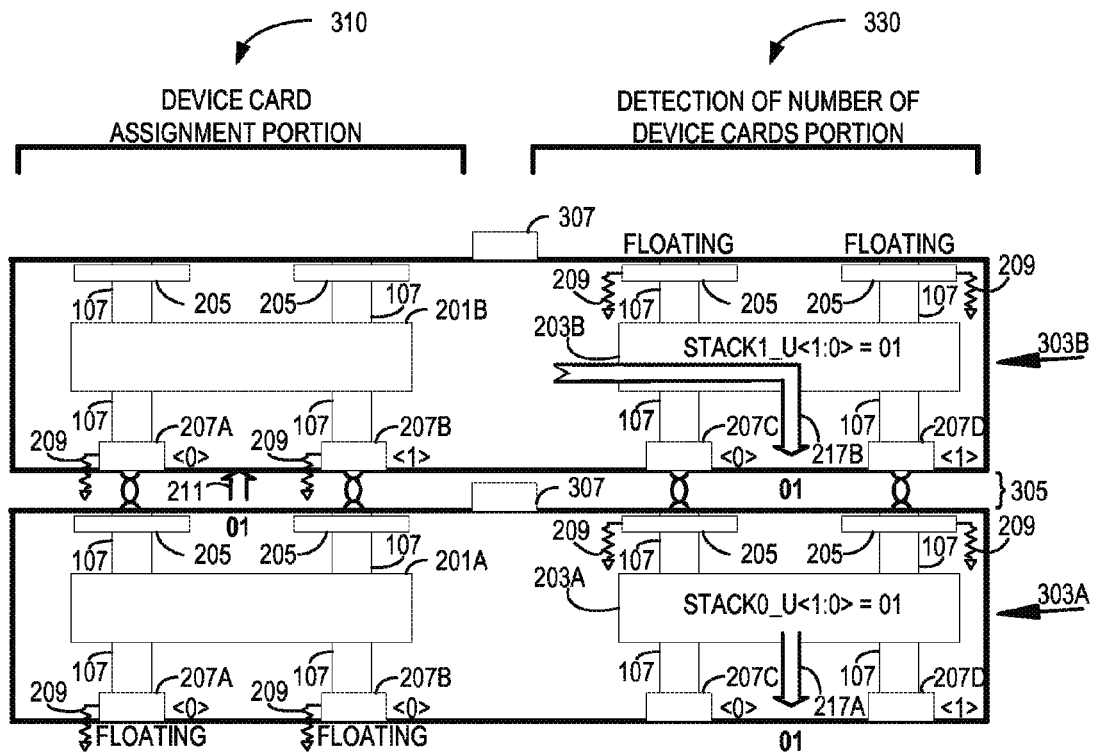
FIG. 3 shows a cross-sectional view of a stacked package having two device cards that are stacked and interconnected and incorporate embodiments of the described subject matter.

With reference now to FIG. 3, a cross-sectional view of a stacked package 300 having a first device-card 303A and a second device-card 303B is shown with the device-cards being stacked and interconnected. The first device-card 303A includes a card assignment portion 310 and a detection of the number of cards portion 330. The card assignment portion 310 includes the assignment device 201A and the detection of the number of cards portion 330 includes the evaluation device 203A. Other elements shown may be similar or the same as those discussed above with reference to FIG. 2A. Similarly, the second device-card 303B includes the card assignment portion 310 having the assignment device 201B and the detection of the number of cards portion 330 having the evaluation device 203B.

Each of the device cards 303A, 303B may include a number of other devices (not shown so as to prevent details of the disclosed subject matter from being obscured). For example, the first device-card 303A and the second device-card 303B may include various additional components formed (e.g., fabricated, placed, etc.) on or within the device cards. The various additional components may comprise, for example, individual integrated circuit devices and/or a number of different discrete devices (e.g., resistors, capacitors, inductors, transistors, other transconductance devices, antennas, switches, TSVs, or combinations thereof). Further, the first device-card 303A and the second device-card 303B may each include different additional components. Thus, the two device cards may each have additional different functions or capabilities from one another. For example, the first device-card 303A may include controller or microprocessor circuitry and the second device-card 303B may include wireless transceiver circuitry.

The first device-card 303A and the second device-card 303B may be interconnected by a variety of pin or jack connectors 305 known independently in the art. The first device-card 303A and the second device-card 303B may be replaced by an end-user. Additionally, the end-user may add additional device cards (not shown). Should replacement or addition of any device cards be desired, the end-user may do so by plugging in new or replacement cards to the stack. The total number of cards that can be stacked depends, at least partially, on the number of inputs and outputs on the assignment and evaluation devices contained on the device cards. Although the assignment devices 201A, 201B and the evaluation devices 203A, 203B of FIG. 3 are shown and described as having a two-bit input and a two-bit output, the assignment and evaluation devices may include any number of one or more bits. For the stacked package 300 of FIG. 3, four device cards may be stacked. Thus, two additional device cards (not shown) may be added to the stacked package 300.

The first time the stacked package 300 is operated, an initialization procedure similar to the procedure discussed with reference to FIG. 2A can be performed. The initialization procedure may be performed automatically upon startup, or may be initiated by the end-user utilizing, for example, a software switch or a hardware reset switch 307. Similarly, each time a device card is replaced or added, the initialization procedure can be again run, either automatically or manually, to assign a unique device ID value to each device card and to determine a total number of device cards in the stacked package.

The procedures to assign a unique device ID value can operate similarly, whether the device comprises a die formed of an elemental or compound semiconductor substrate, with integrated devices formed on one or both sides of the substrate, or whether the device is a plug-in type of device card, with integrated circuit devices and discrete components mounted either thereon or therein. Further, the orientation of surfaces of the device is unimportant. That is, as long as appropriate electrical routing is provided to the assignment devices and the evaluation devices, the devices may be stacked in first side-to-second side, second side-to-second side, or first side-to-first side configurations.

Figure 4:
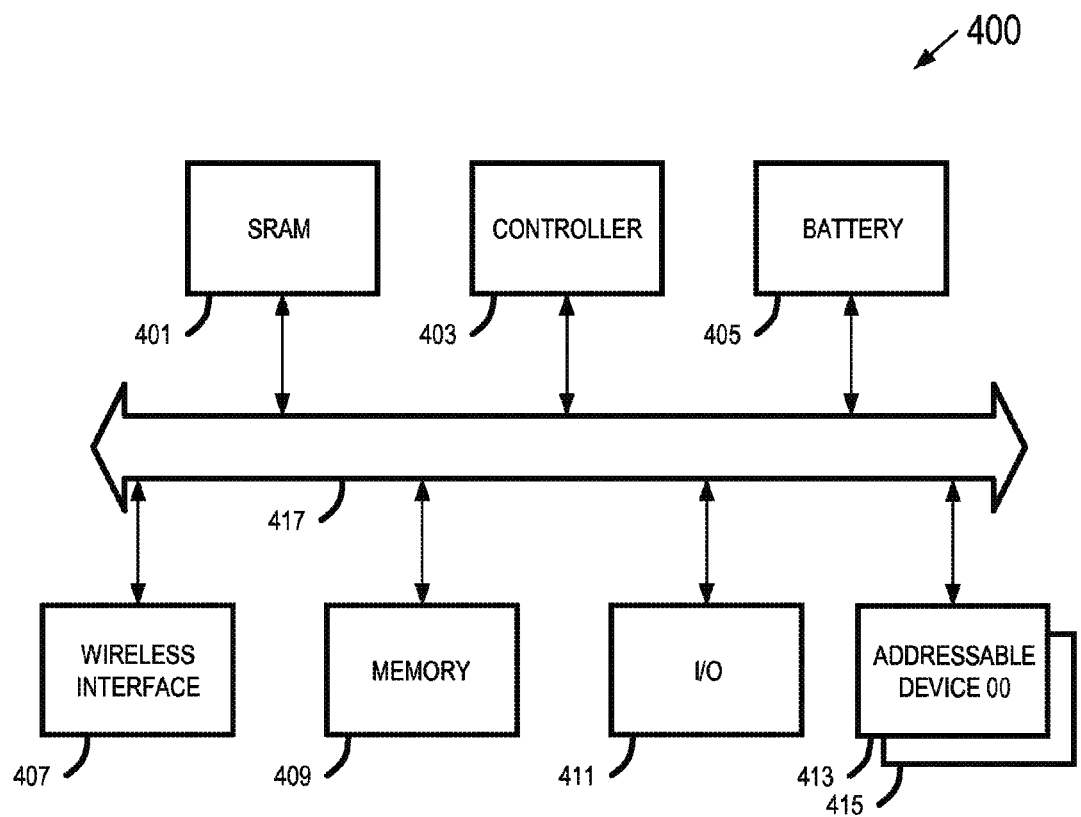
FIG. 4 is a block diagram of a system embodiment, including a memory device and an addressable device having stacked dice.

With reference now to FIG. 4, a block diagram of an illustrative embodiment of an apparatus in the form of a system 400 including one or more memory devices is shown. The memory device may be comprised of stacked integrated circuit dice, as discussed above. The system 400 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 400 may be used in any of the following systems: a wireless local area network (WLAN) system, a wireless personal area network (WPAN) system, or a cellular network.

The system 400 of FIG. 4 is shown to include a controller 403, an input/output (I/O) device 411 (e.g., a keypad, a touchscreen, or a display), a memory device 409, a wireless interface 407, a static random access memory (SRAM) device 401, a first addressable device 413, and a second addressable device 415, coupled to each other via a bus 417. A battery 405 may supply power to the system 400 in one embodiment. The memory device 409 may include a NAND memory, a flash memory, a NOR memory, a combination of these, or the like. The memory device 409 may include one or more of the novel memory devices described herein.

The controller 403 may include, for example, one or more microprocessors, digital signal processors, micro-controllers, or the like. The memory device 409 may be used to store information transmitted to or by the system 400. The memory device 409 may optionally also be used to store information in the form of instructions that are executed by the controller 403 during operation of the system 400 and may be used to store information in the form of user data either generated, collected, or received by the system 400 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 403 may include one or more of the novel memory devices described herein.

The I/O device 411 may be used to generate information. The system 400 may use the wireless interface 407 to transmit and receive information to and from a wireless communication network with a radio frequency (RF) signal. Examples of the wireless interface 407 may include an antenna, or a wireless transceiver, such as a dipole antenna. However, the scope of the inventive subject matter is not limited in this respect. Also, the I/O device 411 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 411 may include one or more of the novel stacked devices described herein.

Further, various embodiments described in the figures can be included as part of various ones of the devices on the bus 417 of FIG. 4. For example, each of the first addressable device 413 and the second addressable device 415 can be an addressable die or other device having a unique device ID, such as the first device-card 303A and the second device-card 303B of FIG. 3.

The various illustrations of the procedures and apparatuses are intended to provide a general understanding of the structure of various embodiments and are not intended to provide a complete description of all the elements and features of the apparatuses and methods that might make use of the structures, features, and materials described herein. Base upon reading and understanding of the disclosed subject matter provided herein, a person of ordinary skill in the art can readily envision other combinations and permutations of the various embodiments. The additional combinations and permutations are all within a scope of the present invention.

In various embodiments, an apparatus is provided that has multiple dice in a stacked device. At least one of the multiple dice includes an assignment device to operate on an input and generate, as an output, a device identification (ID) value. The at least one of the multiple dice also includes an evaluation device to detect a total number of the dice in the stack.

In various embodiments, an apparatus is provided that has multiple devices in a stacked device. At least one of the multiple devices includes an assignment device to operate on an input and generate, as an output, a device identification (ID) value. The at least one of the multiple devices also includes an evaluation device to detect a total number of the devices in the stack.

In various embodiments, an apparatus is provided having a number of dice in a stacked device. At least one of the number of dice includes an assignment device to operate on an input and generate, as an output, a device ID value for a subsequent die in the stacked device. A pull-down device is coupled to an input of the assignment device to provide an initialization value as an input to the assignment device.

In at least some of the embodiments, the apparatus is to perform an evaluation routine to determine the total number of the dice in the stacked device.

In various embodiments, an apparatus is provided comprising multiple devices in a stack of devices. A first one of the devices includes an assignment device to operate on an input and to generate, as an output, a device identification (ID) value. An evaluation device is to detect a total number of devices in the stack, and a switching device is coupled to an input of the assignment device to provide an initialization value as an input to the assignment device.

In various embodiments, an apparatus is provided comprising a stack of dice. A first die in the stack includes an assignment device to operate on an input and to generate, as an output, a device identification (ID) value for a subsequent die in the stack. An evaluation device is to detect a total number of the dice in the stack, and a switching device is to provide an initialization value as a device ID value to be assigned to the first die, the initialization value to serve as an input value to the assignment device.

In at least some of the embodiments, the evaluation device is to evaluate a conditional routine based on an input to the evaluation device, and, based on the input, generate an output upon evaluation of one or more criterion in the conditional routine.

The Abstract of the Disclosure is provided to comply with 37 C.F.R. §1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising N multiple dice in a stacked device, the apparatus comprising:
   an assignment device included in each of at least N−1 of the N multiple dice in the stacked device to generate a sequence of unique device identification (ID) values for at least the N−1 dice, the assignment device to operate on an input provided by a prior one of the N multiple dice for at least the N−1 dice and generate, as an output, one of the sequence of unique device identification (ID) values for the N multiple dice, a first of the N multiple dice not requiring a separate, external device to generate a first in the sequence of unique device ID values, each of the N multiple dice being addressable dice; and
   an evaluation device in at least a plurality of the N multiple dice to detect a total number of the dice in the stack.

2. The apparatus of claim 1, wherein each of the N multiple dice comprises a respective assignment device to generate a respective one of the sequence of unique device ID values.

3. The apparatus of claim 2, wherein the respective assignment device of each of the N−1 dice is coupled to the respective assignment device of at least a respective one other of the N−1 dice through a number of through-substrate vias, wherein the number of through-substrate vias corresponds to the total number of the N multiple dice in the stack.

4. The apparatus of claim 1, wherein a respective one of the sequence of unique device ID values is incremented for each subsequent die in the stack.

5. The apparatus of claim 1, wherein the device ID values generated by each of the assignment devices is assigned to a subsequent die in the stacked device.

6. The apparatus of claim 1, wherein the assignment device comprises an adder circuit.

7. The apparatus of claim 1, wherein the evaluation device comprises an arbiter circuit.

8. The apparatus of claim 1, wherein the assignment device is coupled to a pull-down device and the evaluation device is coupled to a pull-down device.

9. The apparatus of claim 1, wherein the at least one of the multiple dice comprises a first one of the multiple dice, wherein the first one of the multiple dice is assigned a first in a sequence of unique device ID values by a pull-down device, and wherein the device identification (ID) value generated by the assignment device of the first one of the multiple dice comprises a second in the sequence of unique device ID values.

10. The apparatus of claim 1, wherein the at least one of the N multiple dice comprises a first one of the N multiple dice, wherein the first one of the N multiple dice is assigned a first in the sequence of unique device ID values by a pull-up device that is internal to the first one of the N multiple dice, and wherein the device identification (ID) value generated by the assignment device of the first one of the N multiple dice comprises a second in the sequence of unique device ID values.

11. An apparatus comprising N multiple devices in a stack, the apparatus comprising:
   an assignment device included in at least N−1 of the N multiple devices in the stack to generate a sequence of unique device identification (ID) values for at least the N−1 devices, the assignment device to operate on an input provided by a prior one of the N multiple devices for at least the N−1 devices and generate, as an output, one of the sequence of unique device identification (ID) values for the N multiple devices, a first of the N multiple devices not requiring a separate device to generate a first in the sequence of unique device ID values, each of the N multiple dice being addressable devices; and
   an evaluation device included in at least a plurality of the N multiple devices to detect a total number of the devices in the stack.

12. The apparatus of claim 11, wherein the devices are memory dice.

13. The apparatus of claim 11, wherein the devices are device cards.

14. The apparatus of claim 11, wherein each of the N multiple devices may be coupled to at least a respective one other one of the devices.

15. The apparatus of claim 11, further comprising a reset switch coupled to at least ones of the multiple devices.

16. The apparatus of claim 11, wherein the apparatus is to perform an initialization procedure each time a device is added, removed, or replaced from the stack.

17. The apparatus of claim 11, wherein the evaluation device is to receive, as an input, the input to be operated on by at least one of the assignment devices.

18. The apparatus of claim 17, wherein the evaluation device is to provide the total number of devices in the stack to an evaluation device of another one of the devices in the stack.

19. An apparatus comprising a plurality of N dice in a stacked device, the apparatus comprising:
   an assignment device included in at least N−1 of the plurality of N dice to generate a sequence of unique device identification (ID) values for the at least the N−1 dice, the assignment device to operate on an input provided by a prior one of the plurality of N dice for at least the N−1 dice and generate, as an output, one of the sequence of unique device ID values for each subsequent die in the stacked device, a first of the plurality of N dice not requiring a separate device to generate a first in the sequence of unique device ID values, each of the N multiple dice being addressable devices;
   a pull-down device coupled to an input of at least a first one of the assignment devices to provide an initialization value as an input to the first one of the assignment devices; and
   an evaluation device in at least two of the plurality of N dice in the stacked device to detect a total number of the dice in the stack.

20. The apparatus of claim 19, wherein the evaluation device is configured to perform an evaluation routine to determine the total number of the plurality of N dice in the stacked device.

21. The apparatus of claim 19, further comprising a pull-down device coupled to an input of the evaluation device.

22. The apparatus of claim 19, further comprising a number of through-substrate vias to electrically couple an output of the assignment device to an input of an assignment device of a subsequent one of the plurality of dice.

23. The apparatus of claim 19, wherein the input of the first one of the assignment devices floats in a default configuration when the pull-down device is not activated.

24. The apparatus of claim 19, wherein the device ID value generated by the assignment device is stored in non-volatile memory on the subsequent die in the stacked device.

25. An apparatus comprising multiple devices in a stack of devices, the apparatus comprising:
   an assignment device formed on each of the multiple devices to generate a sequence of unique device identification (ID) values for the multiple devices, the assignment device to operate on an input provided by a prior one of the multiple devices in at least N−1 of the multiple devices and to generate, as an output, the unique device identification (ID) value, a first of the multiple devices not requiring a controller to generate a first in the sequence of unique device ID values, each of the multiple devices being addressable devices;
   an evaluation device formed on at least a plurality of the multiple devices to detect a total number of devices in the stack; and
   a switching device coupled to an input of at least one of the assignment devices to provide an initialization value as an input to the at least one assignment device.

26. The apparatus of claim 25, wherein the initialization value is the assigned device ID value for the first one of the devices in the stack.

27. The apparatus of claim 25, wherein the switching device coupled to an input of the assignment device comprises a plurality of switching devices coupled to a plurality of inputs of the assignment device.

28. The apparatus of claim 27, wherein each of the plurality of inputs is to float until a respective coupled one of the plurality of switching devices is activated.

29. The apparatus of claim 25, wherein the switching device is to couple to a power rail.

30. An apparatus comprising a stack of dice, the apparatus comprising:
   an assignment device included in each of at least a plurality of dice in the stack to generate a sequence of unique device identification (ID) values for the at least a plurality of dice, the assignment device to operate on an input provided by a prior one of the at least a plurality of dice in at least N−1 of the plurality of dice and generate, as an output, the unique device identification (ID) value for a subsequent die in the stack, a first of the plurality of dice not requiring a controller to generate a first in the sequence of unique device ID values;
   an evaluation device included in at least the plurality of dice in the stack to detect a total number of the dice in the stack; and
   a switching device to provide an initialization value as a device ID value to be assigned to a first die in the stack, the initialization value to serve as an input value to the assignment device in the subsequent die in the stack.

31. The apparatus of claim 30, wherein the evaluation device is to evaluate a conditional routine based on an input to the evaluation device, and, based on the input, generate an output upon evaluation of one or more criterion in the conditional routine.

* * * * *